United States Patent [19]

Hayasaka et al.

[11] Patent Number: 4,698,238
[45] Date of Patent: Oct. 6, 1987

[54] PATTERN-FORMING METHOD

[75] Inventors: Nobuo Hayasaka; Haruo Okano; Yasuhiro Horiike, all of Tokyo, Japan

[73] Assignee: Kabushiki Kaisha Toshiba, Kawasaki, Japan

[21] Appl. No.: 826,379

[22] Filed: Feb. 5, 1986

[30] Foreign Application Priority Data

Feb. 14, 1985 [JP] Japan .................................. 60-25229

[51] Int. Cl.⁴ .............................................. B05D 3/06
[52] U.S. Cl. .................................. 427/53.1; 430/297; 430/299; 427/54.1; 156/646
[58] Field of Search ..................... 430/297, 298, 299; 427/53.1, 54.1, 43.1; 156/643, 646

[56] References Cited

U.S. PATENT DOCUMENTS 4,107,349  8/1978  Vig ......................................... 427/36
4,414,059 11/1983  Blum et al. ........................ 156/659.1
4,595,601  6/1986  Horioka et al. ..................... 427/53.1

Primary Examiner—John E. Kittle
Assistant Examiner—José G. Dees
Attorney, Agent, or Firm—Oblon, Fisher, Spivak, McClelland, & Maier

[57] ABSTRACT

A pattern is formed by providing a reaction field in which a photo-induced reaction proceeds when a substrate is irradiated with light so as to form a pattern on the substrate, and setting, in the reaction field, conditions for establishing a nonlinear relationship between the intensity of the light and the rate of the photo-induced reaction. The substrate is selectively irradiated with light in the reaction field under the conditions set therein so as to selectively form a pattern in the irradiated portion of the substrate in accordance with the selective irradiation.

11 Claims, 8 Drawing Figures

PATTERN-FORMING METHOD

BACKGROUND OF THE INVENTION

1. The present invention relates to a pattern-forming method, and more particularly, to a method of selectively forming a pattern on a substrate utilizing a photo-induced reaction.

2. Description of the Prior Art

Presently, the pattern used for manufacturing a semiconductor element is formed exclusively by a photo-etching process (PEP). The process comprises the steps of coating a substrate with a photoresist, exposing the coated substrate to light, and developing a resist pattern. In the case of processing a semiconductor surface, a resist pattern formed by PEP is used as a mask for etching the semiconductor surface so as to transfer the pattern of the mask onto the semiconductor surface. However, the pattern-forming technique utilizing PEP requires many steps, making it expensive in terms of manufacturing.

Recently, proposed are a resist pattern-forming technique and an etching technique utilizing a photo-induced reaction. The techniques permit omitting the conventional PEP, leading to a marked reduction in the number of steps and, thus, to lower manufacturing costs. For example, a material is selectively deposited on a semiconductor substrate by utilizing a photochemical reaction. The surface of the semiconductor substrate is processed with the deposited material layer used as a mask. The particular technique permits omitting 3 to 4 steps, compared with the conventional technique utilizing PEP. Also, it suffices to employ a single etching step on the semiconductor substrate, when a photo-induced reaction is utilized.

However, the pattern-forming technique utilizing a photo-induced reaction is defective in that, in forming a fine pattern, the pattern may become blurred by, for example, the diffraction of light, resulting in a failure to produce a sharp pattern.

SUMMARY OF THE INVENTION

An object of the present invention is to provide a pattern-forming method utilizing a photo-induced reaction. The method of the present invention permits overcoming the above-noted drawbacks inherent in the prior art, making it possible to form even a fine pattern accurately.

According to the present invention, there is provided a pattern-forming method, comprising the steps of:

providing a reaction field in which a photo-induced reaction occurs when a substrate is irradiated with light so as to form a pattern on the substrate;

setting, in said reaction field, conditions for establishing a nonlinear relationship between the intensity of the light and the rate of the photo-induced reaction; and selectively irradiating the substrate with light in said reaction field under said conditions so as to selectively form a pattern in the irradiated portion of the substrate in accordance with the selective irradiation.

DETAILED DESCRIPTION OF THE PREFERRED EMBODIMENTS

Before concretely explaining the present invention, the principle of the invention will be described below.

Figure 1:
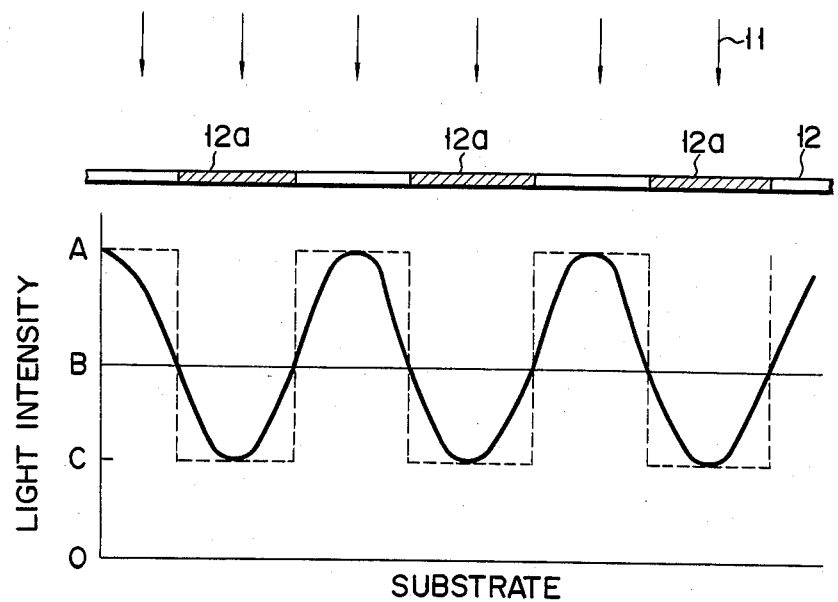
FIG. 1 shows the intensity distribution of light projected through a mask onto a substrate.

It is important to pay attention to the diffraction of light in forming, particularly, a fine pattern on a substrate by means of light irradiation through a photomask. FIG. 1 shows the intensity distribution of light 11 on the substrate surface. Specifically, the light intensity on the substrate surface corresponding to an opaque portion 12a of a photomask 12 does not become zero because of the diffraction of light, as denoted by a solid line in FIG. 1. If the diffraction is not taken into account, the intensity distribution should be in a rectangular form as denoted by a broken line. In other words, even the substrate surface corresponding to opaque portion 12a of mask 12 is actually irradiated with low intensity light.

Figure 2:
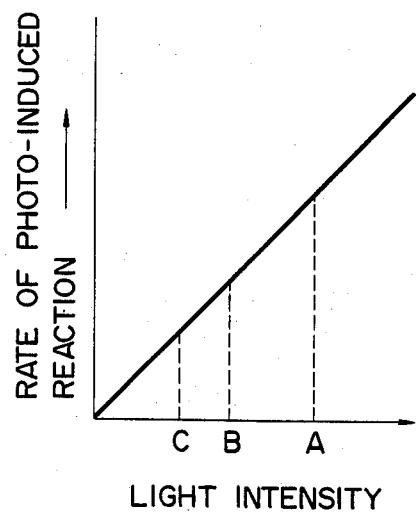
FIG. 2 is a graph showing a linear relationship between the intensity of light and the rate of the photo-induced reaction.
Figure 4:
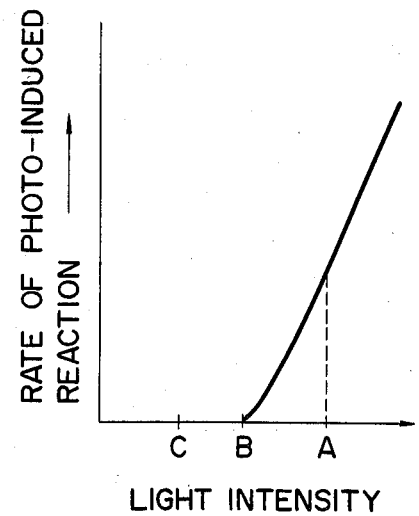
FIG. 4 is a graph showing a nonlinear relationship between the light intensity and the photo-induced reaction rate.
Figure 3:
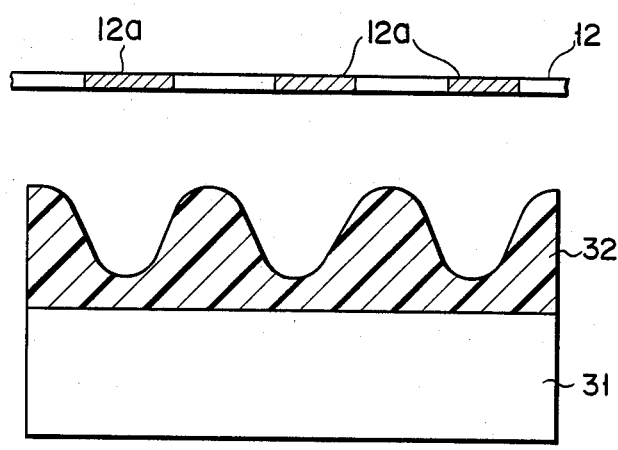
FIG. 3 shows how the reaction product is deposited in the case where the light intensity and the photo-induced reaction rate bear a linear relationship.
Figure 5:
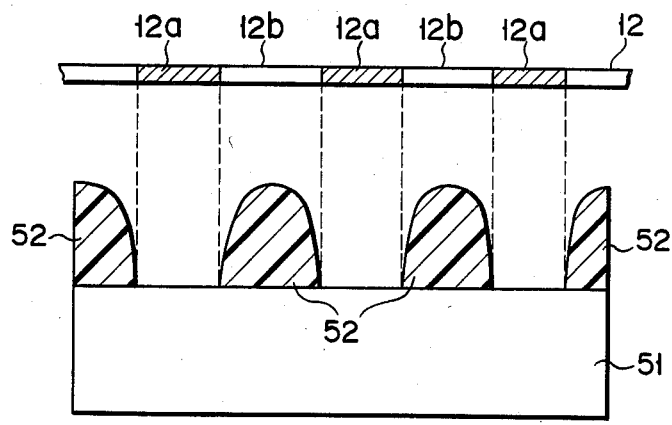
FIG. 5 shows how the reaction product is deposited in the case where the light intensity and the photo-induced reaction rate bear a nonlinear relationship.

It is also important to understand the relationship between the light intensity and the photo-induced reaction rate. When it comes to, for example, a photodepositing reaction, the light intensity is reflected by the thickness of the deposit resulting from the photochemical reaction. Where the reaction rate is directly proportional to the light intensity as shown in FIG. 2, deposit 32 of a nonuniform thickness is formed on the entire surface of substrate 31, as shown in FIG. 3. Where the light intensity and the reaction rate have a nonlinear relationship as shown in FIG. 4, however, deposit 52 is formed on only that surface portion of substrate 51 which corresponds to transparent portion 12b of photomask 12, as shown in FIG. 5. It follows that it is possible to accurately form a fine pattern by providing a nonlinear relationship between the light intensity and the photochemical reaction rate.

Presently known is a direct etching method which utilizes a photo-induced reaction hot using an etching mask. This method also permits forming a sharp etching pattern by providing a nonlinear relationship between the etching rate and the light intensity.

In short, the present invention provides the particular conditions for establishing a nonlinear relationship between the photo-induced reaction rate and the light intensity in the reaction field in which a fine pattern is formed by photo-induced reaction.

The photo-induced reaction utilized in the present invention includes a photochemical reaction and photoablation. Also, the pattern formed by the method of the present invention includes a pattern of the photo-chemical reaction product selectively deposited on a substrate and an etching pattern formed by selective etching of the substrate. Further, the substrate used in this specification and claims includes a semiconductor substrate itself and a semiconductor substrate, a surface of which is covered with a film such as a metallic film, an insulating film, a semiconductor material film or an organic film.

The selective etching and deposition employed in the present invention are effected as follows:

A. Selective Etching (i) Etching based on Photochemical Reaction

The present invention makes it possible to accurately etch a metallic film, an insulating film, and a semiconductor material film, e.g., a silicon film, particularly, an $n^+$-polysilicon film and a non-doped polysilicon film. In this case, a substrate having such a film formed thereon is placed in a vacuum vessel. An etching gas of $Cl_2$ or a mixture of $Cl_2$ and $F_2$ is introduced into the vacuum vessel together with a deposit-forming gas, i.e., a gas forming a deposit. If the substrate is selectively irradiated with light through, for example, a photomask, a deposit derived from the deposit-forming gas is formed on that portion of the substrate which is not irradiated with light. The resultant deposit acts as an etching mask. The deposited film is selectively removed on the irradiated portion to expose the substrate portion, which is etched by the etching gas.

The etching with $Cl_2$ or $Cl_2$-$F_2$ mixture is isotropic and the etching rate is directly proportional to the light intensity. However, a nonlinear relationship is provided between the etching rate and the light intensity by introducing the deposit-forming gas into the reaction field. The deposit (mainly a polymer) derived from the deposit-forming gas should be removed faster in the light-irradiated portion than in the non-irradiated portion. Deposit-forming gasses meeting this requirement include, for example, tetramethylsilane, methyl methacrylate, and fluorinated hydrocarbon such as tetrafluoroethylene.

The etching gas is introduced into the vaccum vessel at a pressure of 0.05 torrs to 10 torrs. The amount of deposit-forming gas introduced into the vacuum vessel is 1% to 20% of the etching gas. Any kind of light can be used in the present invention if it can remove the deposit. In general, ultraviolet light is used in the present invention. The etching temperature ranges in general from 10° C. to 40° C. The intensity of ultraviolet light ranges between 0.1 and 0.5 W/cm$^2$.

(ii) Selective Etching based on Photo-Ablation

A chemical reaction does not accompany the etching based on photo-ablation. In this case, the film portion irradiated with light is selectively removed by dissolving (melting) and evaporating. The method of the present invention permits accurately etching an organic film, particularly, a polymethyl methacrylate film and a polymer film of a fluorinated hydrocarbon such as a polytetrafluoroethylene film. The etching is performed by selectively irradiating the organic film with light under vacuum, i.e., 0.1 torrs or less. The organic film can also be etched by selectively projecting light within an active gas, e.g., chlorine gas at a pressure of 0.1 to 1 torrs. In general, a KrF laser light or an ArF laser light is used in the present invention at an intensity of 0.1 to 3 W/cm$^2$. If photo-ablation is carried out under the conditions given above, a nonlinear relationship is provided between the light intensity and the ablation rate (etching rate), making it possible to effect accurate etching.

B. Selective Deposition

The method of the present invention permits accurately forming an organic material pattern on a substrate through a photochemical reaction. Specifically, a reactive gas such as methyl methacrylate or a fluorinated hydrocarbon such as tetrafluoroethylene is irradiated with a KrF laser light (249 nm) or ArF laser light so as to polymerize the reactive gas. As a result, a polymer film is selectively formed on that surface of the substrate which is not irradiated with the light. The intensity of the laser light ranges between 0.5 and 2 W/cm$^2$. Under the conditions given above, a nonlinear relationship is established between the polymerization reaction rate and the light intensity.

The reactive gas used in the selective deposition is excited by a microwave discharge to form active species. If the excited reactive gas (active species) is brought into contact with a substrate put in a vacuum vessel disposed apart from the field of discharge, a polymer film is formed on the entire surface of the substrate. The substrate having a polymer film formed thereon is selectively irradiated with the laser light described above, which dissolves and removes the irradiated portion of the polymer film. Since a nonlinear relationship is established between the light intensity and the polymer dissolving rate as mentioned above, the polymer film is selectively allowed to remain undissolved in the portion which was not irradiated by the light so as to form a polymer film pattern.

Figure 6:
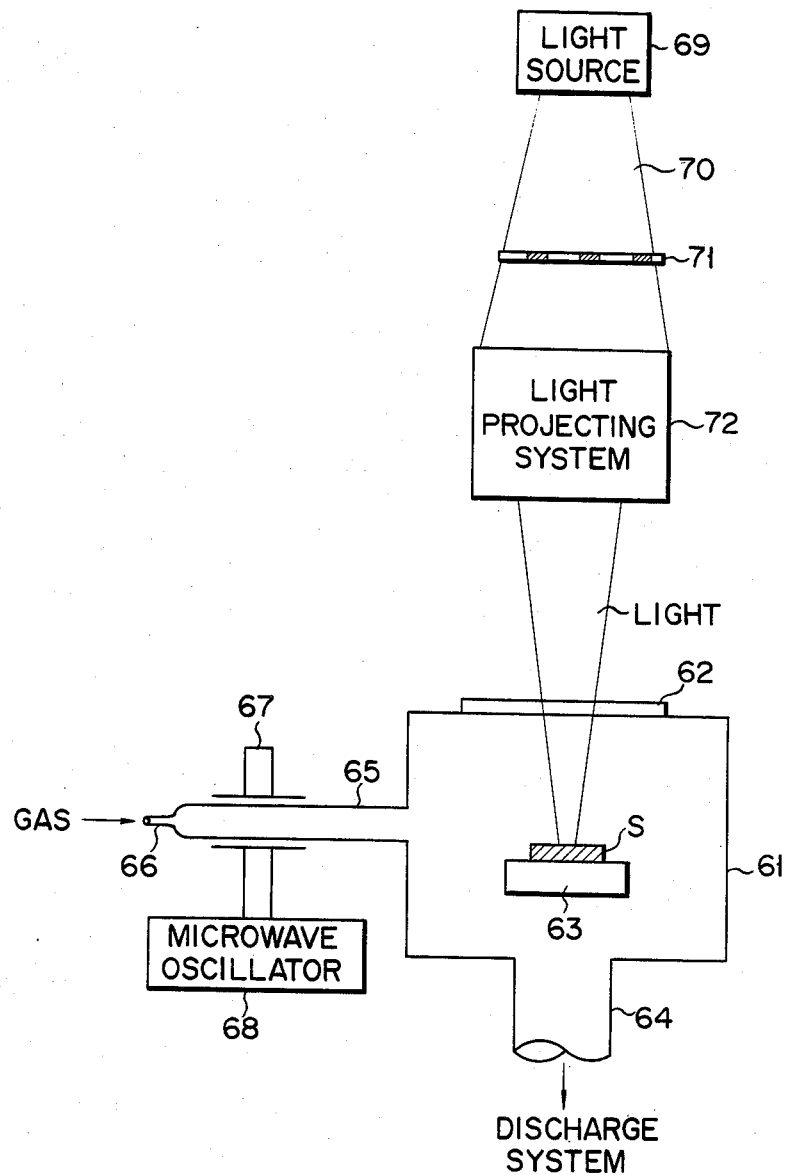
FIG. 6 schematically illustrates an apparatus used to effect the method of the present invention.

FIG. 6 illustrates an apparatus to effect the method of the present invention. As seen from the figure, the apparatus comprises vacuum vessel 61 provided with transparent window 62 formed at the top, and gas outlet port 64 connected to a gas discharge system and formed at the bottom. Also, quartz tube 65 having gas inlet port 66 is connected to the side of vacuum vessel 61. A support member for supporting substrate S, which is to be treated, is disposed within vacuum vessel 61. A wave guide connected to a microwave oscillator 68 is provided around quartz tube 65. Further, light source 69 is disposed above vessel 61. Substrate S is irradiated with the light emitted from light source 69 after passing through photomask 71, light projecting system 72 and transparent window 62 of vessel 61.

Figure 8:
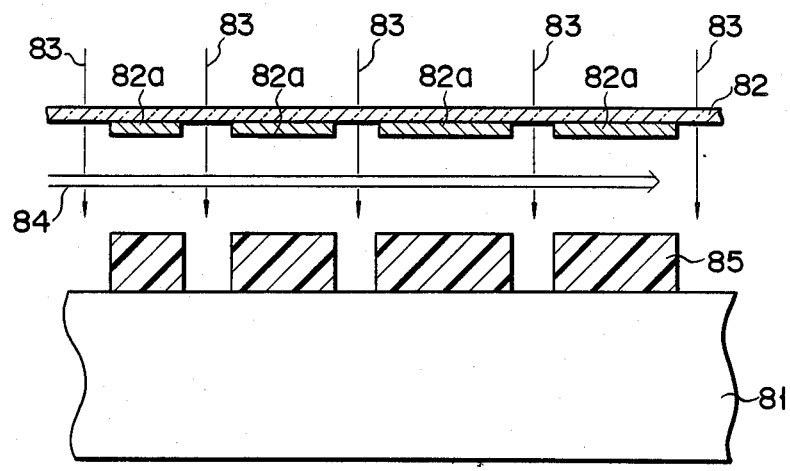
FIG. 8 is a cross sectional view explaining another embodiment of the present invention.

FIG. 8 is intended to explain another embodiment of the present invention. In this case, substrate 81 is exposed to a reactive gas atmosphere and is selectively irradiated with light 83 via photo mask 82 having opaque portions 82a so as to form a polymer film derived from the reactive gas on the entire surface of the substrate 81. Another light 84 parallel with substrate 81 is simultaneously projected in this step. If light 84 has an intensity higher than a certain level, a photochemical reaction takes place to selectively etch or dissolve the polymer film so as to form polymer film pattern 85 on substrate 81.

EXAMPLE

An etching mask formation and etching operation using the formed etching mask were performed by the method of the present invention using the apparatus shown in FIG. 6. Specifically, semiconductor substrate S having an $n^+$-type polysilicon layer 600 nm thick formed on the entire surface was put in vacuum vessel 61. A tetrafluoroethylene gas introduced into quartz tube 65 was excited by the discharge of a microwave from the wave guide connected to the microwave oscillator 68. The excited gas was introduced into vacuum vessel 61 at a flow rate of 30 SCCM to form a polymer film 100 nm thick on the polysilicon layer formed on substrate S. The polymer film thus formed was derived from the excited tetrafluoroethylene and contained carbon and fluorine. Introduction of the tetrafluoroethylene gas into the vessel 61 was stopped upon formation of the polymer film.

Figure 7:
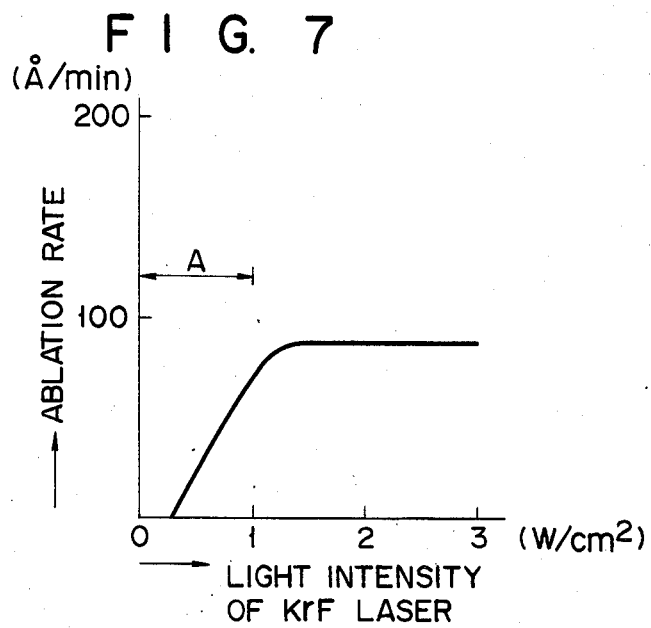
FIG. 7 is a graph showing the relationship between the light intensity and the ablation rate of an organic film.

Then, substrate S was irradiated with a KrF laser light (249 nm) emitted from light source 69 after passing through photomask 71. The polymer film was removed by dissolving and evaporating by laser light irradiation. However, a nonlinear relationship was found between the rate of ablation and the laser light intensity as shown in FIG. 7. Thus, a polymer film pattern having a line width of 1500 nm was accurately formed by adjusting the light intensity such that the light intensity on the surface of the substrate S was distributed within region A shown in FIG. 7, i.e., between 0 and 1.0 W/cm$^2$.

After formation of the polymer film pattern, vacuum vessel 61 was sufficiently evacuated, followed by introduction of a Cl$_2$ gas and a tetramethylsilane gas into vessel 61 at a flow rate of 50 SCCM and 10 SCCM, respectively, to produce a total pressure of 50 torrs within the vessel. During introduction of these gases, the microwave oscillator 68 was not operated. Vessel 61 containing these gases was irradiated with ultraviolet light emitted from light source 69. A polysilicon film is isotropically etched when using a Cl$_2$ gas alone. If a tetramethyl silane gas is also used, however, the polymer derived from the tetramethylsilane gas is deposited on only that side of the polyfluoroethylene film (etching mask) which is not irradiated with light. Since the deposited polymer film serves to prevent an under-cut below the etching mask, the n$^+$-type polysilicon film was vertically etched. Thus, a sharp pattern of a n$^+$-type polysilicon film was very accurately formed.

As described above, the method of the present invention makes it possible to form even a fine pattern with high accuracy.

The present invention, which was described in conjunction with etching and deposition, is not restricted to only etching and deposition. For example, it is thought possible to apply the technical idea of the present invention to the formation of an oxide film pattern utilizing a photo-oxidation reaction and to the formation of an impurity region utilizing photo-induced diffusion.

What is claimed is:

1. A pattern-forming method, comprising:
   (a) providing a reaction field in which a photo-induced reaction occurs when a substrate is irradiated with light under an atmosphere of a deposit-forming gas which forms a polymeric material upon irradiation with light so as to form a pattern on said substrate;
   (b) setting, in said reaction field, conditions for establishing a nonlinear relationship between the intensity of the light and the rate of the photo-induced reaction; and
   (c) selectively irradiating the substrate with light in said reaction field under said conditions to polymerize said deposit-forming gas and thus selectively depositing said polymeric material on that portion of said substrate which is not irradiated with the light.

2. The method according to claim 1, wherein said deposit-forming gas is selected from methyl methacrylate and a fluorinated hydrocarbon gas.

3. The method according to claim 1, wherein the light is a KrF laser light.

4. The method according to claim 1, wherein said organic film is formed by activating, at a region apart from said reaction field, a reactive gas from which said organic film is derived, thereby forming active species, and introducing said active species into said reaction field.

5. A pattern-forming method, comprising:
   (a) providing a reaction field in which a photo-induced reaction occurs when a substrate is irradiated with light in the presence of a deposit-forming gas which forms a polymeric material upon irradiation with light and a reactive etching gas selected from the group consisting of chlorine gas and a gas containing chlorine and fluorine so as to form a pattern on said substrate, said substrate having a film comprising a material selected from the group consisting of a metallic material, an insulating material and a semiconductor material formed on the surface of the substrate;
   (b) setting, in said reaction field, conditions for establishing a nonlinear relationship between the intensity of the light and the rate of the photo-induced reaction; and
   (c) selectively irradiating the substrate with light in said reaction field under said conditions so as to selectively etch said film on said substrate with the selective formation of said polymeric material acting as an etching mask, thereby forming a pattern in the irradiated portion of said film at said substrate in accordance with the selective irradiation.

6. The method according to claim 5, wherein said film formed on the surface of said substrate comprises n$^+$-polysilicon.

7. The method according to claim 5, wherein the deposit-forming gas is methyl methacrylate or tetramethyl silane.

8. The method according to claim 5, wherein the light is ultraviolet light.

9. The method according to claim 5, wherein the light is a KrF laser light or an ArF laser light.

10. The method according to claim 5, wherein said conditions for establishing a non-linear relationship between the intensity of the light and the rate of the photo-induced reaction are effected by removing the polymeric material deposit, formed from the deposit-forming gas, at a faster rate in the light-irradiated portion than in the non-irradiated portion.

11. The method according to claim 5, wherein said etching gas is introduced at a pressure of 0.05–10 torrs, and said deposit-forming gas is introduced in the amount 1–20% of the etching gas.

* * * * *